US 12,107,389 B2

(12) United States Patent
Feral et al.

(10) Patent No.: US 12,107,389 B2
(45) Date of Patent: Oct. 1, 2024

(54) HIGH-POWER LASER AMPLIFIER HEAD

(71) Applicants: Centre National De La Recherche Scientifique, Paris (FR); UNIVERSITE DE BORDEAUX, Bordeaux (FR); COMMISSARIAT A L'ENERGIE ATOMIQUE ET AUX ENERGIES ALTERNATIVES, Paris (FR)

(72) Inventors: Christophe Feral, Martignas sur Jalle (FR); Jérôme Lhermite, Anglet (FR); Jérémy Brandam, Talence (FR); Denis Marion, Pessac (FR)

(73) Assignees: Centre National De La Recherche Scientifique, Paris (FR); UNIVERSITE DE BORDEAUX, Bordeaux (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 751 days.

(21) Appl. No.: 17/291,826

(22) PCT Filed: Oct. 24, 2019

(86) PCT No.: PCT/EP2019/079111
§ 371 (c)(1),
(2) Date: May 6, 2021

(87) PCT Pub. No.: WO2020/094416
PCT Pub. Date: May 14, 2020

(65) Prior Publication Data
US 2021/0391688 A1  Dec. 16, 2021

(30) Foreign Application Priority Data

Nov. 6, 2018 (FR) ...................... 1860215

(51) Int. Cl.
H01S 5/04 (2006.01)
H01S 5/02208 (2021.01)
H01S 5/024 (2006.01)

(52) U.S. Cl.
CPC .......... H01S 5/041 (2013.01); H01S 5/02208 (2013.01); H01S 5/02423 (2013.01)

(58) Field of Classification Search
CPC .. H01S 5/041; H01S 5/02208; H01S 5/02423; H01S 3/2316; H01S 3/04;
(Continued)

(56) References Cited

U.S. PATENT DOCUMENTS 5,210,768 A * 5/1993 Seguin ................. H01S 3/081
372/18
7,280,571 B2 * 10/2007 Rothenberg ......... H01S 3/2383
372/70

(Continued)

FOREIGN PATENT DOCUMENTS

EP    2795745 A2    10/2014

OTHER PUBLICATIONS

Basu, Santanu, "Nd-YAG and Yb-YAG rotary disk lasers", IEEE Journal of Selected Topics in Quantum Electronics, May/Jun. 2005, pp. 626-630, vol. 11, No. 3, IEEE, US.

(Continued)

*Primary Examiner* — Vu A Vu
(74) *Attorney, Agent, or Firm* — Maier & Maier, PLLC

(57) ABSTRACT

A laser amplifier head is provided. The laser amplifier head includes a plurality of plates of a solid-state laser active medium disposed in a housing, arranged parallel to one another with their main surfaces facing one another, the housing being provided with an inlet port and an outlet port for a cooling liquid, and also at least one window allowing a laser beam to pass through the laser active medium plates, wherein it also includes:

(Continued)

a mechanical connection device allowing a cyclic movement at least of the laser active medium plates in relation to the laser beam in a plane (xy) perpendicular to the direction (z) of their thickness; and cooling liquid guide plates arranged in the extension of the laser active medium plates, between the latter and the inlet port of said liquid.

15 Claims, 3 Drawing Sheets

(58) Field of Classification Search
CPC .......... H01S 3/042; H01S 3/0604; H01S 3/07; H01S 3/1026; H01S 3/0401
USPC ...................................... 272/43.01
See application file for complete search history.

(56) References Cited

U.S. PATENT DOCUMENTS

| | | | |
|---|---|---|---|
| 7,400,812 B2* | 7/2008 | Seifert | G02B 6/4457 385/86 |
| 7,593,447 B2* | 9/2009 | Basu | G02F 1/3501 250/493.1 |
| 9,090,315 B1* | 7/2015 | Stone | E21B 41/0085 |
| 9,209,598 B1* | 12/2015 | Reagan | H01S 3/042 |
| 9,680,279 B2* | 6/2017 | Johnson | H01S 3/06704 |
| 11,329,448 B2* | 5/2022 | Mason | H01S 3/08072 |
| 2006/0007800 A1 | 1/2006 | Basu | |

OTHER PUBLICATIONS

Giesen, A., et al., "Scalable Concept for Diode-Pumped High-Power Solid-State Lasers", Appl. Phys. B, May 1994, pp. 365-372, vol. 58, Springer-Verlag, Germany.

Nie, R. Z., et al., "Fully immersed liquid cooling thin-disk oscillator", Laser Physics Letters, Sep. 22, 2014, vol. 11, issue No. 11, article No. 115808, 6 pages, IOP Publishing, UK.

Basu, Santanu, "A Design for a 100-kW Rotary Disk Laser Oscillator with Good Beam Quality", Proceedings of SPIE 7513, 2009 International Conference on Optical Instruments and Technology, Jan. 23, 2010, pp. 75780D-1 to D11, vol. 7578, San Francisco, CA.

Brown, D.C., et al., "Active-Mirror Amplifiers: Progress and Prospects", IEEE Journal of Quantum Electronics, Sep. 1981, pp. 1755-1765, vol. QE-17, No. 9, IEEE, US.

Fu, Xing, et al., "3kW liquid-cooled elastically-supported Nd: YAG multi-slab CW laser resonator", Optics Express, Jul. 2014, pp. 18421-18432, vol. 22, No. 15, Optical Society of America, US.

Fu, Xing, et al., "Direct-liquid-cooled Nd: YAG thin disk laser oscillator", Applied Physics B, May 2013, pp. 517-521, vol. 111, No. 3, Springer, Switzerland.

International Searching Authority, International Search Report and Written Opinion received for International Application No. PCT/EP2019/079111, dated Jan. 29, 2020, 21 pages, European Patent Office, Netherlands.

Lucianetti, A., et al., "Active-mirror-laser-amplifier thermal management with tunable helium pressure at cryogenic temperatures", Optics Express, Jun. 20, 2011, pp. 12766-12780, vol. 19, No. 13, Optical Society of America, US.

National Industrial Property Institute, Preliminary Search Report (PSR) and Written Opinion received for Application No. FR1860215, dated Aug. 5, 2019, 7 pages, Republic of France.

Ongstad, Andrew, et al., "High power Nd: YAG spinning disk laser", Optics Express, Jan. 2016, pp. 108-113, vol. 24, No. 1, Optical Society of America, US.

Wang, Ke, et al., "7KW direct-liquid-cooled side-pumped Nd: YAG multi-disk laser resonator", Optics Express, Jun. 2016, pp. 15012-15020, vol. 24, No. 13, Optical Society of America, US.

* cited by examiner

HIGH-POWER LASER AMPLIFIER HEAD

CROSS-REFERENCE TO RELATED APPLICATIONS

The present application is a national phase entry of PCT/EP2019/079111, filed on Oct. 24, 2019, which claims the benefit of priority of French Application No. 1860215, filed Nov. 6, 2018, the entire contents of which are hereby incorporated by reference in their entirety for all purposes.

TECHNICAL FIELD

The invention relates to a solid-state laser amplifier head which is intended to be used at high power (average power in the order of 1 kW or more, pulses in the order of 1 J or more). The laser head according to the invention is particularly suitable for the implementation of a laser amplifier, but can also be placed inside an optical cavity in order to implement an oscillator or a regenerative amplifier.

BACKGROUND

In the design of a solid-state laser, in particular intended to operate at high powers, the cooling of the active medium is particularly important. In fact, an excessive temperature adversely affects the amplification capacity and the optical quality of the laser beam (thermal lens effect, deformation of the active medium) and its polarization (stress-induced birefringence), and can even cause the degradation or fracture of the active medium.

It is known to shape the active medium in the form of a plate or disk, typically having a thickness which is less—or even much less—than one tenth of its lateral dimensions. The cooling can then be carried out in a plurality of ways:
  Via the mounting, connected to an internal cooling circuit.
  Via the rear, reflective, surface, which requires very small thicknesses of the active medium (300 micrometers typically), and therefore a large number (typically 12 or more) of passageways. This is known as "thin disk" technology or "active mirror" technology for greater thicknesses. See, for example, [1a], [1b], [1c].
  By a fluid incident on the main surfaces of the disk; this fluid is most often a gas, but it can sometimes be a liquid. Document [2], for example, describes a laser oscillator whose active medium is formed from two thin plates of Nd:YAG inclined at Brewster's angle in relation to the optical path of the laser beam and forming an angle between them, immersed in a flow of cooling liquid. Documents [3] and [4] describe laser oscillators whose active medium is formed by a stack of disks having a thickness in the order of the millimeter, a cooling liquid ($D_2O$) flowing in the spaces between the disks.

It is also known to rotate an active medium having large dimensions compared with the diameter of the laser beam, the laser beam being offset in relation to the axis of rotation. The heat is then stored in a greater volume and is exchanged over a larger surface, thereby substantially reducing the technical effects. In this regard, see [5], [6] and [7].

BRIEF SUMMARY

The invention aims to provide a laser amplifier head offering more effective cooling than according to the prior art, thus allowing a higher power level to be achieved without degradation of (or even with an improvement in) the optical quality of the laser beam.

According to the invention, this object is achieved by a laser head whose active medium is made up of a stack of thin plates rotating around a common axis (or, more generally, having a cyclic movement) and immersed in a liquid flow.

The combined use of a plurality of moving thin plates and cooling by liquid poses a particular difficulty: in fact, in the absence of particular precautions, the liquid flow tends to become turbulent, thereby substantially degrading the quality of the laser beam (article [8], for example, illustrates the effects of the turbulence in the case of a thin-disk laser oscillator without moving parts). The invention solves this problem by using cooling liquid guide plates arranged in the extension of the laser active medium plates, thus ensuring a laminar flow where the laser beam passes.

Another aspect of the invention consists in an effective removal of the stimulated amplification radiation, made possible through the use of transparent cooling liquid guide plates, preferably associated with mirrors which deflect the radiation toward an absorbing and diffusing region.

One subject matter of the invention is therefore a laser amplifier head comprising a plurality of plates of a solid-state laser active medium disposed in a housing, arranged parallel to one another with their main surfaces facing one another, for example aligned according to a propagation direction of a laser beam, the housing being provided with an inlet port and an outlet port for a cooling liquid, and also at least one window allowing a laser beam to pass through the laser active medium plates, characterized in that it also comprises:
  a mechanical connection device allowing a cyclic movement at least of the laser active medium plates in relation to the laser beam in a plane perpendicular to the direction of their thickness; and
  cooling liquid guide plates arranged in the extension of the laser active medium plates, between the latter and the inlet port of said liquid.

According to particular embodiments of the invention:
  The mechanical connection device can be configured to cause the laser active medium plates to rotate around a common axis, perpendicular to the direction of their thickness, in relation to the housing. The common axis can, in particular, be parallel to the direction of propagation of the laser beam. The one or more windows can further be arranged in such a way that the laser beam passes through a region of said laser active medium plates between the inlet port of the cooling liquid and the common axis of rotation.
  The cooling liquid guide plates can be transparent in a spectral band of an amplified spontaneous emission radiation of the laser active medium plates, in such a way as to allow the removal of said radiation. In this case, the amplifier head can also comprise mirrors to deflect a portion of said amplified spontaneous emission radiation removed through the cooling liquid guide plates and initially directed toward the inlet port of the cooling liquid. The amplifier head can furthermore also comprise, inside said housing, at least one optically absorbing and diffusing structure in said spectral band of the amplified spontaneous emission radiation, said optically absorbing and diffusing structure at least partially surrounding the laser active medium plates in a plane perpendicular to the direction of their thickness and being arranged in such a way as to be in contact with said cooling liquid. Said optically absorbing and diffusing structure advantageously comprises an array of studs. The amplifier head can furthermore also comprise at least one transparent wall in said spectral band of the amplified spontaneous emission radiation and separating, on one hand, a region of the volume within the housing containing the laser active medium plates, the cooling liquid guide plates and the inlet port, and, on the other hand, said or each said optically absorbing and diffusing structure and the outlet port.

The cooling liquid guide plates can have a width which is less than that of the laser active medium plates.

The laser active medium plates can have a thickness of between 300 μm and 1 cm and a mutual spacing of between 200 μm and 4 mm.

The laser active medium plates may be disk-shaped.

The amplifier head can also comprise a pump which has a fluid connection to the inlet port and to the outlet port and which is suitable for causing a flow of the cooling liquid in the housing, the dimensioning and the arrangement of the pump, the housing, the laser active medium plates and the cooling liquid guide plates being such that the flow is laminar in a region through which the laser beam passes, then causes a transition to a turbulent regime.

The amplifier head can also comprise an actuator interworking with the mechanical connection device to cause said cyclic movement of the active medium plates.

The amplifier head can also comprise a longitudinal optical pumping system.

BRIEF DESCRIPTION OF THE SEVERAL VIEWS OF THE DRAWING(S)

Other characteristics, details and advantages of the invention will become evident from reading the description given with reference to the attached drawings provided by way of example, wherein, respectively:

FIG. 1 shows a cutaway view of a laser amplifier head according to a first embodiment of the invention;

FIGS. 2A and 2B respectively show a sectional view and a top view of a laser amplifier head according to a second embodiment of the invention;

DETAILED DESCRIPTION

Figure 1:
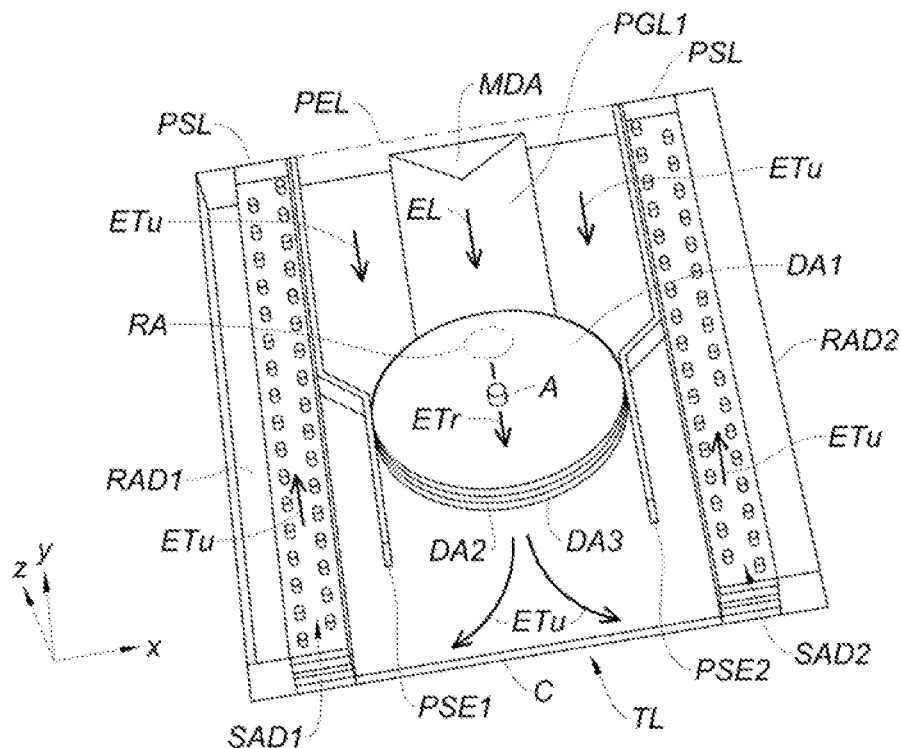

The cutaway view shown in FIG. 1 provides an understanding of the structure of a laser amplifier head according to a first embodiment of the invention. The laser active medium is made up of three plates, more precisely disks, DA1, DA2, DA3 consisting of yttrium-aluminum-garnet (YAG) doped with ytterbium (Yb:YAG), having a thickness of 3 mm and a diameter of 70 mm, mounted in series on a tree A passing through their center, with a spacing between two adjacent disks of 500 μm. The tree A allows the disks to be rotated, for example at a speed of between 1 and 10 revolutions per second. The assembly is placed inside a parallelepiped-shaped housing C. The reference z denotes the orientation direction of the tree A, and the references x, y denote axes perpendicular to one another and to the axis z defining a plane parallel to the main surfaces of the disks.

The laser beam to be amplified and the pump laser beam which enter and exit the housing via windows or porthole (see FIG. 5 for more details), pass through the three disks in an eccentric manner. The reference RA denotes the footprint of the laser beams on the disk DA1. Due to the rotation, the heat generated by the pumping is distributed in a crown (reference CO in FIG. 2A). Due to the thermal inertia of the disks, the local temperature increase when the beam passes remains limited to a few degrees. The heat is further distributed over a larger surface area than that of the laser beam, the surface area of heat exchange with the cooling liquid increases and the temperature of the disk is reduced thereby.

The disks advantageously have different dopings, calculated in such a way that they are subjected to the same heat load.

The cooling liquid—for example heavy water, $D_2O$, which is less absorbing than light water ($H_2O$) at the emission wavelength of the Yb:YAG (1.030 nm)—re-enters the housing via an inlet port PEL, flows in the direction of the active material disks, guided laterally by two separating walls PSE1, PSE2 defining a central channel. In the embodiment shown in FIG. 1, the channel initially has a width greater than the diameter of the disks DA1-DA3, then the walls PSE1, PSE2 come closer together until they almost touch the disks, causing the flow to accelerate. After having passed through the region containing the disks, the liquid—which re-enters at 10° C. then exits heated by a few degrees—ascends via two lateral channels located on the sides of the housing and separated from the central channel by the walls PSE1, PSE2. The lateral channels contain arrays of metal studs SAD1, SAD2, the function of which will be explained below, and open out into one or more liquid outlet ports PSL. Metal radiators RAD1, RAD2, forming the lateral walls of the housing, allow the removal of a part of the heat transported by the liquid.

Three liquid guide plates, PGL1, PGL2, PGL3, are disposed in the middle part of the central channel. Each liquid guide plate has the same thickness as a laser active material disk and is located in its extension. The gap between a liquid guide plate and the corresponding disk is preferably less than or equal to 500 μm and the offset in the direction of the thickness of the plates (z) is less than or equal to 50 μm (see FIGS. 3A-3C and the corresponding discussion below).

The function of the plates PGL1, PGL2, PGL3 is to ensure that the flow of the cooling liquid is laminar in the region through which the laser beam passes. As shown in FIG. 1, the flow is laminar (EL) between the plates PGL1, PGL2, PGL3, and turbulent (ETu) on the sides of the central channel. The flow remains laminar during the first centimeters that it travels between the active medium disks and, in particular, corresponding to the region RA, and then it makes a transition to a turbulent regime (the reference ETr denotes the flow at the laminar-to-turbulent transition), which offers the advantage of increasing the thermal exchange coefficient. The flow is turbulent downstream of the active medium disks and, in particular, in the lateral channels.

Assuming an inter-disk space of 500 μm and a speed of the liquid of 2 m/s, the local Reynolds number is 2000. Now, the literature reveals that, in this geometry, the flow is laminar up to a Reynolds number of around 2500. The turbulent-to-laminar transition length is around 68 mm; plates PGL1, PGL2, PGL3 having a length greater than this value, for example 80 mm, will therefore be chosen.

Figures 2A, 2B:
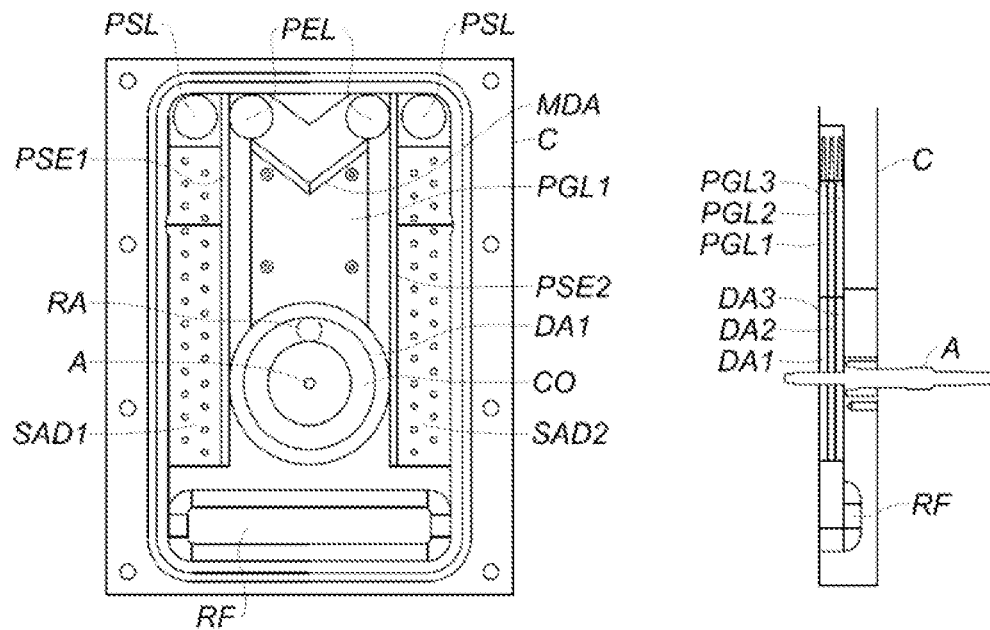

FIGS. 2A and 2B illustrate a second embodiment in which the walls PSE1, PSE2 are straight and parallel, such that the width of the central channel is throughout hardly greater than the diameter of the disks. A groove RF with rounded edges forming a hollow which creates a zone in which the flow can extend, and therefore slows down, can also be noted in the "low" part (opposite the liquid inlet and outlet ports), thus facilitating its ascent via the sides.

Figures 3A, 3B, 3C:
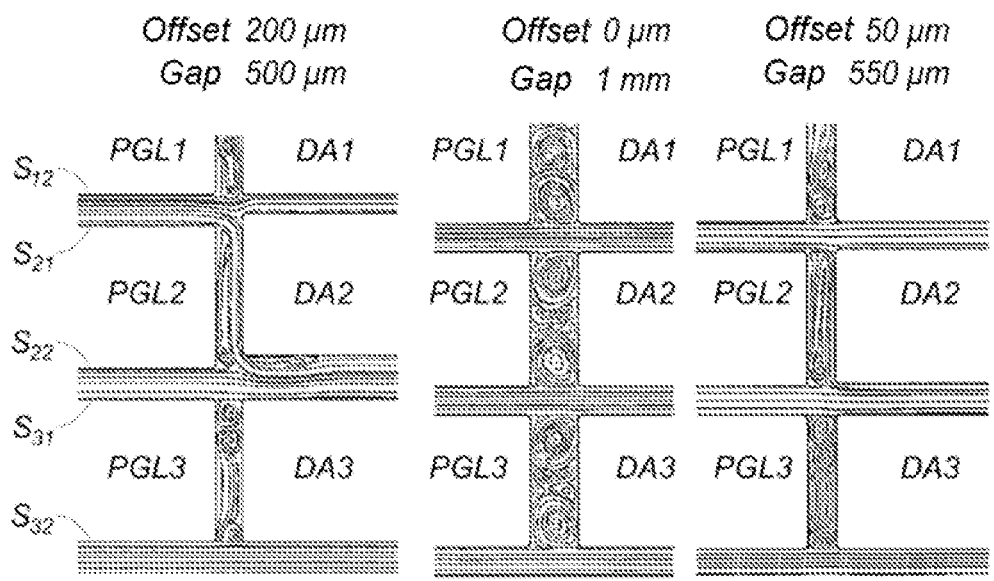
FIGS. 3A, 3B, 3C show the flows of the cooling liquid for different values of the spacing and offset between the cooling liquid guide plates and the laser active medium plates.

The plates PGL1-PGL3 which allow the shaping of the laminar water flow upstream of the disks are fixed, whereas the latter rotate. A gap therefore necessarily exists between these two types of components. Moreover, due to the inevitable mechanical tolerances, an offset will generally exist in the direction z between each liquid guide plate and the corresponding disk. 2D simulations of the flows have been created for three examples, illustrated by FIGS. 3A, 3B and 3C:

FIG. 3A: gap of 500 μm and offset of 200 μm;
FIG. 3B: gap of 1 mm and offset of zero;
FIG. 3C: gap of 550 μm and offset of 50 μm.

It can be observed that the flow is confined in the space between the upper main surface (not shown) of the first disk and the upper wall of the housing (not shown); between the lower main surface $S_{12}$ of the first disk and the upper main surface $S_{21}$ of the second disk; between the lower main surface $S_{22}$ of the second disk and the upper main surface $S_{31}$ of the third disk; and between the lower main surface $S_{32}$ of the third disk and the lower wall of the housing.

It is important to bear in mind the difference between fluid recirculation and turbulence. A fluid recirculation is stationary or quasi-stationary; it can be laminar or turbulent. A turbulence varies rapidly with time, its size more often being much less than that of a recirculation. Rapid recirculation is most often accompanied by turbulence.

In the case of FIG. 3A, the narrowing of the second channel from the top down causes the fluid to slow down due to frictional forces which become substantial. The flow lines are disturbed in the central channel subjected to an offset of 200 μm. Recirculation effects are generated immediately after the gap, at a high speed. Turbulence (not visible in the simulation) can appear at this location. An offset of 200 μm is evidently too great for an optimum flow.

In the case of FIG. 3B, substantial recirculation is observed in the gap, but this does not disturb the main flow, since it occurs at low speed.

In the case of FIG. 3C, corresponding to an offset of 50 μm, the disturbance in the main flow remains acceptable; above all, it diminishes in the space of a few millimeters in such a way that the flow becomes laminar once more before reaching the edge of the laser beam. A tolerance in the order of 50 μm can therefore be taken for the alignment of the plates and disks.

In addition to controlling the laminarity of the flow of the cooling liquid, managing the stray radiation of amplified spontaneous emission (ASE) is an important aspect of the emission. In fact, more than 75% of the incident energy provided by the pump beam which is almost entirely absorbed is emitted once more in the form of ASE radiation (compared with 15-20% of energy transferred to the laser beam to be amplified, the remaining part being absorbed by the active medium and converted directly into heat). This radiation is almost entirely emitted in the transverse direction (plane xy), since the gain is much greater there than in the direction of the thickness of the disks (z).

If no particular precaution is taken, the ASE radiation runs the risk of overheating the housing and, consequently, the cooling liquid. In the amplifier heads shown in FIGS. 1 and 2A/2B, this is avoided in the following manner:

First of all, not only the cooling liquid guide plates PGL1, PGL2, PGL3, but also the separating walls PSE1, PSE2 are transparent in the spectral band of this radiation, such that they do not absorb said radiation and heat up close to the laser active medium disks. The ASE radiation can thus propagate freely through these elements, at a distance from the active medium.

A mirror MDA, for example triangular in shape, is arranged at the end of the cooling liquid guide plates PGL1, PGL2, PGL3 that is most distant from the laser active medium disks. The function of this mirror is to deflect the ASE radiation directed toward the cooling liquid inlet toward the sides of the housing. In the absence of the mirror MDA, the radiation would be absorbed by the region of the housing close to the inlet port of the cooling liquid, which would be heated before even reaching the disks.

Diffusing and absorbing structures SAD1, SAD2 are arranged on the sides of the housing. These structures comprise, for example, arrays of metal (for example copper) studs having an absorbing surface (for example of black chrome). They diffuse and absorb the ASE radiation before it reaches the walls of the housing, and prevent any backscattering of this radiation toward the disk. The radiation reflected by the mirror MDA reaches the structures SAD1, SAD2 also. These structures are cooled by the (lukewarm) liquid which flows toward the outlet port. They further tend to make the flow of this liquid even more turbulent, thus increasing the thermal exchange coefficient. A diffusing and absorbing structure could also be provided in the "base" of the housing (after the groove RF in the case of FIGS. 2A/2B), but this is less important since this region is more distant from the active zone of the disks, and the ASE radiation arrives there in attenuated form.

Figure 4:
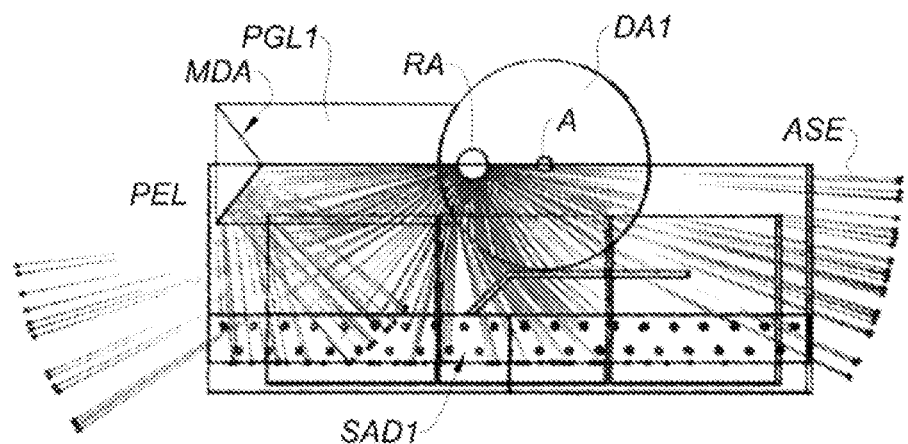
FIG. 4 shows a diagram of the transport of amplified spontaneous emission radiation in the laser head shown in FIG. 1.

FIG. 4 shows the propagation of the ASE radiation in the amplifier head shown in FIG. 2, simulated by means of a ray-tracing algorithm.

Figure 5:
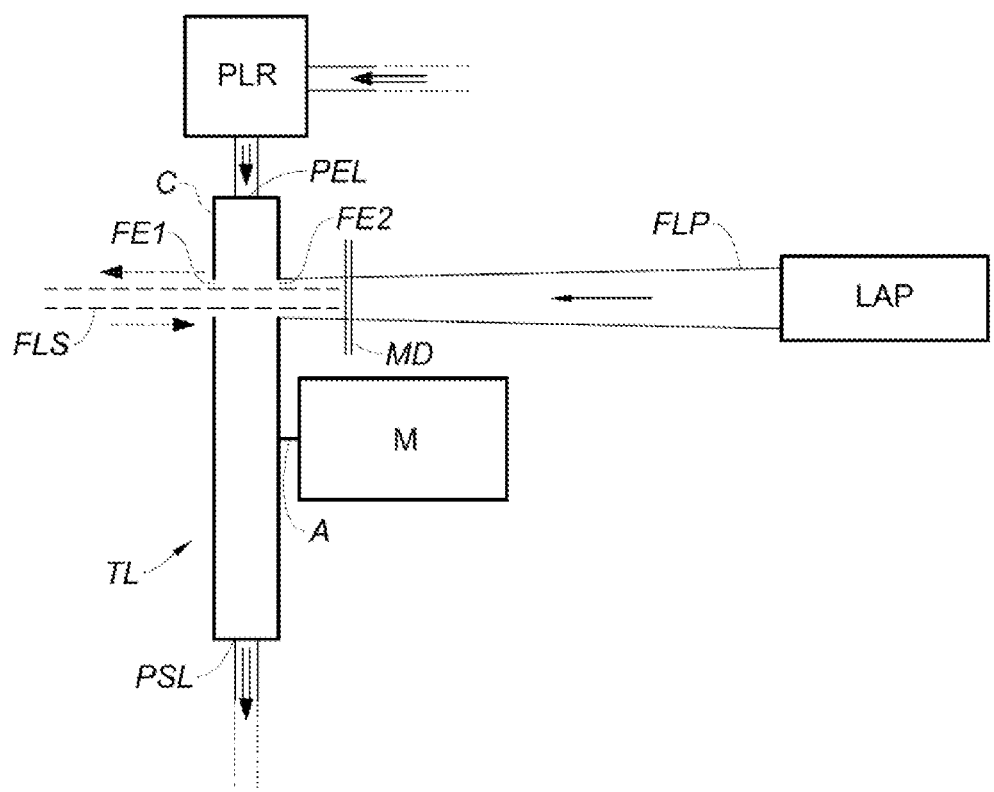
FIG. 5 shows a diagram of a laser amplifier implementing an amplifier head according to the invention.

FIG. 5 shows an optical amplifier implementing an amplifier head of the type shown in FIG. 1 or in FIGS. 2A/B. The tree A is rotated by the electric motor M. A fluid circuit containing cooling liquid is connected to the inlet port and to the outlet port of the housing, a pump PLR being provided close to the inlet port in order to cause a flow, at a desired rate, of said liquid. The housing has two windows FE1, FE2 arranged facing one another on either side of the disks DA1-DA3. A pump laser beam FLP, emitted by a pump laser source LAP, typically comprising diodes, passes through a dichroic mirror MD, then enters the housing via the window FE2; it is almost entirely absorbed by the laser active medium disks. The laser beam to be amplified (or "signal") enters the housing via the window FE1, passes through the disks DA1-DA3 which amplify it, exits via the window FE2, is reflected by the dichroic mirror MD, re-enters the housing via the window FE2, passes a second time through the laser active medium disks which amplify it even more, then exits via the window FE1 and propagates in the opposite direction to that of its arrival.

The amplified laser beam can be separated from the pump beam by means of a second dichroic mirror or a polarizer, or by utilizing a slight angular offset. The amplified laser beam can similarly be offset slightly at an angle from the incoming beam entering the laser head in such a way as to allow its removal; this also makes it possible to perform a plurality of passes through the amplifier medium. Alternatively, the amplified beam can be removed through polarization rotation by means of a quarter-wave plate and a Pockels cell associated with a polarizer.

The laser head shown in FIG. 1 has been subject to thermal modelling. A simulation has been performed with the following parameters:

Incident pump power: 16 kW/cm$^2$, or 13 kW in total;
Laser-heat energy conversion coefficient (quantum default): 0.1;
Pump beam diameter: 10 mm;
Diameter of the laser beam to be amplified: 8 mm;
Thermal exchange coefficient in forced convection estimated at h=5000 Wm$^{-2}$K$^{-1}$;
Temperature of the cooling fluid at the inlet: 10° C.;
Radius of rotation: 25 mm;
Rotation speed: 2 revolutions/second;
Radius of the disks: 70 mm;
Thickness of disk DA1=2.35 mm, doping 1.5%, absorption 160.5 m$^{-1}$;
Thickness of disk DA2=2.35 mm, doping 2.0%, absorption 214 m$^{-1}$;
Thickness of disk DA3=3.22 mm, doping 2.0%, absorption 214 m$^{-1}$.

In the amplifier, an average doping at 2% and a total traversed thickness of 9 mm allows absorption of more than 95% of the pump.

The simulation shows that the average central temperature of the disks, once the steady state is established, does not exceed 50° C.; the surface of the disks for its part remains at around 35° C. The heat is concentrated on a ring having a width equal to the diameter of the pump beam, thus indicating that the thermal conductivity is not sufficient to expect a removal of the heat by the sides and justifies the choice of separating the amplifier medium into three thinner disks in order to allow the removal of the heat from the center toward the surface with a reasonable temperature difference (around 10° C.). A temporal variation, the maximum value of which is in the order of +/−7° C., is superimposed on this average temperature due to the successive heating and cooling phases caused by the rotation of the disks. The maximum instantaneous temperature of the disks does not therefore exceed 57° C.

Thermal expansion deforms the disks, which assume the shape of a plate having a maximum deformation of 3.5 μm. The constraints are concentrated on the trace of the beam with a maximum of 6.22×10$^7$ Pa. This value remains lower by three orders of magnitude than the Young modulus, which indicates that this remains within the domain of the constraints and elastic deformations, far from the mechanical fracture thresholds of the component.

The heating of the disks and the liquid waves which separate them cause optical disturbances which are due not only to the temperature dependence of the refractive indices (thermal lens effect), but also to the mechanical deformation of the disks.

It must be noted that the thermo-optical coefficients of YAG and water are opposite in sign, resulting in partial compensation of the deflection and thermal lens phenomena.

The optical deflection calculations reveal that the laser beam is deflected by an angle of at most several tens of microradians (μrad), which may be compensated by means of a cylindrical lens having a horizontal axis and a focal length equal to a few meters. The residual aberrations are estimated below the wavelength.

The housing is mainly heated by the ASE radiation; thanks to the presence of the structures SAD1, SAD2 and of the mirror MDA, the maximum temperature is in the order of 50° C., well below the boiling point of water at atmospheric pressure.

The invention has been described with reference to two particular embodiments, but numerous variants are conceivable.

The laser amplifier head structure according to the invention can be used for any solid-state active medium, whether it be monocrystalline, polycrystalline (ceramic) or amorphous (glass), regardless of its emission wavelength and its mode of operation (pulsed or continuous).

Not only dopant ions for the laser effect, but also co-dopants allowing homogenization of the dopant ion concentration or modification of the spectral profile of the gain can be incorporated in the active medium. The different disks can have different characteristics: nature of the matrix, dopants and co-dopants, in terms of type and concentration.

The described embodiments use a laser diode pumping, with a pump beam collinear with the beam to be amplified, but other optical pumping methods—for example lateral pumping.

In the embodiment shown in FIG. 5, the laser beam to be amplified makes a round trip in the amplifier head. However, it is possible for it to make a single pass; conversely the amplifier head according to the invention can be used in a multipass or regenerative amplifier, or even in a laser oscillator. It is not always necessary for the housing to have two optical windows, or porthole, facing one another; for example, a single window may suffice if the housing also contains a mirror reflecting the laser beam.

The number of disks (and, consequently, the number of liquid guide plates), as well as their thickness, has been given purely by way of example and can vary. The laser active medium disks can be inclined in relation to the laser beam to be amplified, for example at Brewster's angle, as in references [3] and [4] (which nonetheless requires an adaptation of the intensity of the pump beam). It is not even essential for them to be strictly coaxial, provided that the laser beam to be amplified can pass through them at the same time.

Dimensions of the active medium disks, and also values of spacing and tolerances for the offset and gaps between disks and liquid guide plates have been given purely by way of examples. More generally, but also in a non-limiting manner, the disks can have a thickness of between 300 μm and 1 cm and a mutual spacing of between 200 μm and 4 mm, from the time when the Reynolds number remains below 2500. Other dimensioning is possible, provided that a laminar flow of the cooling liquid in the region through which the laser beam passes is ensured.

It is also possible to replace the rotational movement of the laser active medium plates (which will then not necessarily be circular "disks") with a different cyclic movement, for example a linear oscillation. The term "cyclic" is understood to mean a periodic or, more generally, alternate movement which returns periodically to the same configuration; in this case, the tree A can be replaced with a different mechanical connection device, such as a sliding guide. The shape of the liquid guide plates must be adapted to the shape and movement of the active medium plates. Furthermore, in the case of a translational movement, the entire amplifier head will preferably move in relation to the laser beam to be amplified, and not only the laser active medium plates in relation to the housing as in the case of the rotating disks.

Any other actuator can be used instead of the electric motor M.

The cooling liquid used will depend on the chemical nature of the active medium and its emission wavelength. Its mechanical properties (viscosity, density) and thermal properties (specific heat capacity, thermal conductivity, boiling point, etc.) will determine the dimensioning of the amplifier head.

In the embodiments shown in FIGS. 1 and 2A/2B, the cooling liquid "descends" from the inlet port toward the laser active medium disks, then "ascends" on the sides toward the outlet ports, passing through the absorbing and diffusing structures SAD1, SAD2. Alternatively, the flow can occur in a single direction, the outlet port being arranged opposite the inlet port.

The absorbing and diffusing structures SAD1, SAD2 can have a shape and nature which differ from those shown in the figures. They can surround the laser active medium disks on all sides (i.e. also in the "base" of the housing), or even on four sides, except when corresponding to the cooling liquid guide plates. Conversely, they can be absent, although this degrades the thermal performance of the invention; in this case, they can be replaced with absorbing crowns at the periphery of the laser active medium disks.

The mirror MDA may be absent, or its shape may not be triangular (it may be a simple inclined mirror, or it may have a convex shape other than triangular).

The laser active medium plates can be beveled and/or chamfered in order to limit the internal reflections of the ASE radiation. However, in the embodiment described in detail above, this is not essential: the coefficient of reflection at the active medium-cooling liquid interface is in fact only 2.2% and the transverse gain less than or equal to 8, giving a gain-loss product of less than 0.18—far from the value of 1 which would enable a laser oscillation in the transverse direction. Moreover, as the pump beam is eccentric in relation to the active medium disks, the reflections on the edges tend to distribute the ASE over parts of the disk where there is no pumping, and therefore no gain.

As mentioned above, the amplifier head can be used in a multipass, or even regenerative, configuration. Moreover, the pump beam can be recycled.

REFERENCES

[1a] BROWN, D. C., KELLY, J. H., ABATE, J. H. Active-Mirror Amplifiers: Progress and Prospects. IEEE Journal of Quantum Electronics, Vol. QE-17, No. 7, September 1981.

[1b] GIESEN, A., HUGEL, H., VOSS, A., WITTIG, K., BRAUCH, U., OPOWER, H., Scalable Concept for Diode-Pumped High-Power Solid-State Lasers, Appl. Phys. B 58, 365-372 (1994).

[1c] LUCIANETTI, A., ALBACH, D., CHANTELOUP, J.-C., Active-mirror-laser-amplifier thermal management with tunable helium pressure at cryogenic temperatures, Optics Express, Vol. 19, No. 13, 20 Jun. 2011.

[2] NIE, R. Z., SHE, J. B., ZHAO, P. F., et al. Fully immersed liquid cooling thin-disk oscillator. Laser Physics Letters, 2014, vol. 11, no 11, p. 115808.

[3] F U, Xing, L I, Peilin, L I U, Qiang, et al. 3 kW liquid-cooled elastically-supported Nd: YAG multi-slab CW laser resonator. Optics express, 2014, vol. 22, no 15, p. 18421-18432.

[4] WANG, Ke, T U, Bo, J I A, Chunyan, et al. 7 kW direct-liquid-cooled side-pumped Nd: YAG multi-disk laser resonator. Optics Express, 2016, vol. 24, no 13, p. 15012-15020.

[5] BASU, Santanu. Nd-YAG and Yb-YAG rotary disk lasers. IEEE Journal of selected topics in quantum electronics, 2005, vol. 11, no 3, p. 626-630.

[6] US 2006/0007800

[7] ONGSTAD, Andrew P., GUY, Matthew, and CHAVEZ, Joeseph R. High power Nd: YAG spinning disk laser. Optics Express, 2016, vol. 24, no 1, p. 108-113.

[8] FU, Xing, L I U, Qiang, L I, Peilin, et al. Direct-liquid-cooled Nd: YAG thin disk laser oscillator. Applied Physics B, 2013, vol. 111, no 3, p. 517-521.

The invention claimed is:

1. A laser amplifier head comprising a plurality of plates of a solid-state laser active medium disposed in a housing, arranged parallel to one another with their main surfaces facing one another, the housing being provided with an inlet port and an outlet port for a cooling liquid, and also at least one window allowing a laser beam to pass through the laser active medium plates, characterized in that it also comprises:
   a mechanical connection device allowing a cyclic movement at least of the laser active medium plates in relation to the laser beam in a plane (xy) perpendicular to the direction (z) of the thickness of the solid-state laser active medium plates; and
   cooling liquid guide plates arranged in the extension of the solid-state laser active medium plates, between the solid-state laser active medium plates and the inlet port of said liquid.

2. The laser amplifier head as claimed in claim 1, wherein the mechanical connection device is configured to cause the laser active medium plates to rotate around a common axis, perpendicular to the direction of their thickness, in relation to the housing.

3. The laser amplifier head as claimed in claim 2, wherein said common axis (z) is parallel to the direction of propagation of the laser beam.

4. The laser amplifier head as claimed in claim 2, in which the one or more windows are arranged in such a way that the laser beam passes through a region of said laser active medium plates between the inlet port of the cooling liquid and the common axis of rotation.

5. The laser amplifier head as claimed in claim 1, wherein the cooling liquid guide plates are transparent in a spectral band of an amplified spontaneous emission radiation of the laser active medium plates, in such a way as to allow the removal of said radiation.

6. The laser amplifier head as claimed in claim 5, further comprising mirrors to deflect a portion of said amplified spontaneous emission radiation removed through the cooling liquid guide plates and initially directed toward the inlet port of the cooling liquid.

7. The laser amplifier head as claimed in claim 5, further comprising, inside said housing, at least one optically absorbing and diffusing structure in said spectral band of the amplified spontaneous emission radiation, said optically absorbing and diffusing structure at least partially surrounding the laser active medium plates in a plane perpendicular to the direction of their thickness and being arranged in such a way as to be in contact with said cooling liquid.

8. The laser amplifier head as claimed in claim 7, wherein said optically absorbing and diffusing structure comprises an array of studs.

9. The laser amplifier head as claimed in claim 7, further comprising at least one transparent wall in said spectral band of the amplified spontaneous emission radiation and separating, on one hand, a region of the volume within the housing containing the laser active medium plates, the cooling liquid guide plates and the inlet port, and, on the other hand, said or each said optically absorbing and diffusing structure and the outlet port.

10. The laser amplifier head as claimed in claim 1, wherein the cooling liquid guide plates have a width which is less than that of the laser active medium plates.

11. The laser amplifier head as claimed in claim 1, wherein the laser active medium plates have a thickness of between 300 µm and 1 cm and a mutual spacing of between 200 µm and 4 mm.

12. The laser amplifier head as claimed in claim 1, wherein the laser active medium plates are disk-shaped.

13. The laser amplifier head as claimed in claim 1, further comprising a pump which has a fluid connection to the inlet port and to the outlet port and which is suitable for causing a flow of the cooling liquid in the housing, the dimensioning and the arrangement of the pump, the housing, the laser active medium plates and the cooling liquid guide plates being such that the flow is laminar in a region through which the laser beam passes, then causes a transition to a turbulent regime.

14. The laser amplifier head as claimed in claim 1, further comprising an actuator interworking with the mechanical connection device to cause said cyclic movement of the active medium plates.

15. The laser amplifier head as claimed in claim 1, further comprising a longitudinal optical pumping system.

* * * * *